United States Patent
Sander

(10) Patent No.: US 11,935,718 B2
(45) Date of Patent: Mar. 19, 2024

(54) METHOD FOR DETECTING FAULTS IN A SWITCH ASSEMBLY, DEVICE, COMPUTER PROGRAM PRODUCT, AND COMPUTER-READABLE MEDIUM

(71) Applicant: HELLA GMBH & CO. KGAA, Lippstadt (DE)

(72) Inventor: Alexander Sander, Lippstadt (DE)

(73) Assignee: Hella GmbH & CO. KGAA, Lippstadt (DE)

( * ) Notice: Subject to any disclaimer, the term of this patent is extended or adjusted under 35 U.S.C. 154(b) by 194 days.

(21) Appl. No.: 16/665,601

(22) Filed: Oct. 28, 2019

(65) Prior Publication Data
US 2020/0066471 A1   Feb. 27, 2020

Related U.S. Application Data

(63) Continuation of application No. PCT/EP2018/060020, filed on Apr. 19, 2018.

(30) Foreign Application Priority Data

Apr. 26, 2017   (DE) ..................... 10 2017 108 869.5

(51) Int. Cl.
*H01H 71/04* (2006.01)
*B60D 1/24* (2006.01)
(Continued)

(52) U.S. Cl.
CPC ............. *H01H 71/04* (2013.01); *B60D 1/246* (2013.01); *B60D 1/26* (2013.01); *B60D 1/64* (2013.01);
(Continued)

(58) Field of Classification Search
CPC ............. H01H 71/04; H01H 2071/042; H01H 2071/044; H01H 2231/026; B60D 1/246;
(Continued)

(56) References Cited

U.S. PATENT DOCUMENTS

| | | | |
|---|---|---|---|
| 3,689,717 A | | 9/1972 | Westenhaver |
| 6,000,709 A | * | 12/1999 | Gentner ................... B60D 1/54 180/178 |
| 6,124,726 A | | 9/2000 | Dohnal et al. |

FOREIGN PATENT DOCUMENTS

| | | |
|---|---|---|
| DE | 197 44 465 C1 | 3/1999 |
| DE | 101 04 188 A1 | 7/2002 |

(Continued)

*Primary Examiner* — Thienvu V Tran
*Assistant Examiner* — Sreeya Sreevatsa
(74) *Attorney, Agent, or Firm* — Muncy, Geissler, Olds & Lowe, P.C.

(57) ABSTRACT

A method for detecting faults in a switch assembly includes at least one switch for monitoring the position of a component that can be moved by means of a drive which has an electric motor includes shifting the movable component from a first position to a second position spatially separated from the first position, wherein the power consumption of the electric motor changes in a previously specified manner, and wherein the switch state of the switch during a proper functioning of the switch changes in a previously specified manner, analyzing the power consumption of the electric motor and the switch state of the switch in an analysis unit, and triggering a fault action if the power consumption of the electric motor has changed in the previously specified manner and the switch state of the switch has not changed in the previously specified manner.

21 Claims, 2 Drawing Sheets

(51) Int. Cl.
  *B60D 1/26* (2006.01)
  *B60D 1/64* (2006.01)
  *G01R 21/133* (2006.01)

(52) U.S. Cl.
  CPC ... *G01R 21/1336* (2013.01); *H01H 2071/042* (2013.01); *H01H 2071/044* (2013.01)

(58) Field of Classification Search
  CPC ... B60D 1/26; B60D 1/64; B60D 1/54; B60D 1/62; G01R 21/1336
  USPC .......................................................... 335/18
  See application file for complete search history.

(56) References Cited

FOREIGN PATENT DOCUMENTS

| | | | | |
|---|---|---|---|---|
| DE | 10104188 A1 * | 7/2002 | ............... | B60D 1/06 |
| DE | 10 2014 219 151 A1 | 3/2016 | | |
| DE | 102014219149 A1 * | 3/2016 | ............... | B60D 1/54 |
| EP | 1225068 B1 * | 2/2005 | ............... | B60D 1/06 |
| EP | 1 555 683 A1 | 7/2005 | | |
| EP | 1555683 A1 * | 7/2005 | ........... | H01H 1/0015 |
| EP | 1634729 B1 * | 1/2008 | ............. | B60D 1/246 |
| EP | 2862732 A1 * | 4/2015 | ............... | B60D 1/54 |

\* cited by examiner

METHOD FOR DETECTING FAULTS IN A SWITCH ASSEMBLY, DEVICE, COMPUTER PROGRAM PRODUCT, AND COMPUTER-READABLE MEDIUM

This nonprovisional application is a continuation of International Application No. PCT/EP2018/060020, which was filed on Apr. 19, 2018, and which claims priority to German Patent Application No. 10 2017 108 869.5, which was filed in Germany on Apr. 26, 2017, and which are both herein incorporated by reference.

BACKGROUND OF THE INVENTION

Field of the Invention

The present invention relates to a method for detecting faults in a switch assembly comprising at least one switch for monitoring the position of a component that can be moved via a drive which has an electric motor, to a device for carrying out the method, to a computer program product, and to a computer-readable medium.

Description of the Background Art

Methods for detecting faults in a switch assembly comprising at least one switch for monitoring the position of a component that can be moved by means of a drive which has an electric motor, devices for carrying out the methods, corresponding computer program products, and computer-readable media are already known from the prior art in numerous design variants.

SUMMARY OF THE INVENTION

It is therefore an object of the present invention to detect with little effort malfunctions in a switch assembly comprising at least one switch for monitoring the position of a component that can be moved by means of a drive which has an electric motor.

A major advantage of the invention is in particular that the effort for detecting faults in a switch assembly comprising at least one switch for monitoring the position of a component that can be moved by means of a drive which has an electric motor is kept low. This enables a fault detection that does not require additional components. In addition, the power consumption of the electric motor is independent of the switch state of the at least one switch of the switch assembly, so that the switch state of the at least one switch of the switch assembly does not have an undesirable influence on the power consumption of the electric motor.

In principle, it is conceivable that the method of the invention finds application only when the movable component shifts from its first position to its second position. In embodiments of movable components, which in their intended use are shifted both from their first position to their second position as well as from their second position to their first position, therefore, are moved back and forth between their first position and their second position, an advantageous refinement of the method of the invention, in the case of the movable component shifted to its second position, provides the following additional method steps: shifting the movable component from its second position to its first position, wherein the power consumption of the electric motor changes in a further previously specified manner, and wherein the switch state of the switch during a proper functioning of the switch changes in a further previously specified manner; analyzing the power consumption of the electric motor and the switch state of the switch in the analysis unit and triggering a further fault action, if the power consumption of the electric motor has changed in the further previously specified manner and the switch state of the switch has not changed in the further previously specified manner. In this way, both malfunctions of the switch assembly are made possible when the movable component shifts from its first position to its second position as well as when the movable component shifts from its second position to its first position.

The change in the power consumption of the electric motor, when the movable component shifts from its first position to its second position, or from its first position to its second position and from its second position to the first position, is freely selectable within broad suitable limits. Advantageously, another refinement of the method of the invention provides that the power consumption of the electric motor increases at least to a previously specified threshold value when the movable component shifts from its first position to its second position or increases at least to a further previously specified threshold value when the movable component shifts from its second position to its first position. As a result, the change in the power consumption of the electric motor is realized in a metrologically simple way in a previously specified manner when the movable component shifts from its first position to its second position, or from its first position to its second position and from its second position to its first position.

A further advantageous refinement of the method of the invention provides that the change in the power consumption of the electric motor in a previously specified manner when the movable component shifts from its first position to its second position continues at least for a previously specified period of time or when the movable component shifts from its second position to its first position continues at least for a further previously specified period of time. It is ensured in this way, for example, that merely brief peak currents or the like do not affect the analysis in an undesirable manner.

Moreover, it is conceivable, on the one hand, that when the movable component shifts from its first position to its second position, the power consumption of the electric motor is increased at least to a previously specified threshold value and when the movable component shifts from its second position to its first position at least to a further previously specified threshold value.

On the other hand, it is also possible that the change of the power consumption of the electric motor when the movable component shifts from its first position to its second position continues at least for a previously specified period of time and when the movable component shifts from its second position to its first position continues at least for a further previously specified period of time.

Further, the previously specified threshold value for the power consumption of the electric motor when the movable component shifts from its first position to its second position can coincide with the further previously specified threshold value for the power consumption of the electric motor when the movable component shifts from its second position to its first position. The same applies to the previously specified period of time and the further previously specified period of time.

Analogous to the refinement of the method of the invention, an advantageous refinement of the device of the invention, in which the movable component can be shifted by means of the drive additionally from the second position to the first position and in which in the aforementioned shifting of the movable component, the switch state of the switch changes in a further previously specified manner during a proper functioning of the switch, provides that in the aforementioned shifting of the movable component, the power consumption of the electric motor changes in a further previously specified manner and the analysis unit is designed such that, depending on the analysis of the switch state of the switch and the analysis of the power consumption of the electric motor, a further fault action can be triggered by the analysis unit.

In principle, the component that can be moved by means of a drive which has an electric motor is freely selectable according to type, function, material, dimensioning, and arrangement within broad suitable limits. Expediently, the movable component is formed as a locking pin for locking a trailer hitch for a motor vehicle.

Also, the at least one switch of the switch assembly for monitoring the position of the movable component can be freely selected according to type, function, material, dimensioning, arrangement, and electrical connection with the rest of the switch assembly within broad suitable limits. Advantageously, at least one of the switches of the switch assembly is embodied with at least one switch as a diagnosable switch. In this way, the fault detection is formed redundantly in the switch assembly.

The method of the invention for detecting faults in a switch assembly comprising at least one switch for monitoring the position of a component that can be moved by means of a drive which has an electric motor, the device of the invention for carrying out the method, the computer program product of the invention, and the computer-readable medium of the invention will be explained in more detail below using an exemplary embodiment.

The device of the invention has a movable component embodied as a locking pin for locking a trailer hitch, designed as a semi-automatic coupling, for a motor vehicle. The user, therefore, for example, the driver of the motor vehicle, starts the unfolding of the foldable trailer hitch located in a receptacle of the motor vehicle by actuating a control element, for example, a push button marked accordingly and located in a trunk of the motor vehicle.

When the push button is pressed, the locking pin, which locks the trailer hitch in a rest position of the trailer hitch in the receptacle of the motor vehicle, is shifted from its locking position to an unlocking position by means of a drive which has an electric motor, wherein the trailer hitch in the locking position of the locking pin is locked in the receptacle, whereas the trailer hitch in the unlocking position of the locking pin can swivel out of the receptacle by gravity. In addition to the electric motor, the drive can comprise still further components, such as a gear.

The user, therefore, for example, the driver of the motor vehicle, can manually shift the trailer hitch from the swiveled-out position of the trailer hitch to a use position of the trailer hitch. In the use position of the trailer hitch, the electric motor of the drive in a manner known to the skilled artisan, for example, by actuating an end switch in the shifting of the trailer hitch to its use position, is made to shift the locking pin in the opposite direction, namely from its unlocking position to its locking position, so that the trailer hitch is also locked in its use position also by means of the locking pin.

In an analogous way, the user can again manually shift the trailer hitch from its use position back to its rest position. It is also possible for the user not to shift the trailer coupling from the swiveled-out position to its use position, but manually back to its rest position.

The device further has a switch assembly comprising at least one switch for monitoring the position of the locking pin. The at least one switch is designed as a mechanical switch, which can be actuated by the locking pin when the locking pin is shifted from its locking position to its unlocking position. A switch state of the at least one switch of the switch assembly and the power consumption of the electric motor of the drive are analyzed in an analysis unit in a manner explained in more detail below.

In the abovementioned shifting of the locking pin from its locking position to its unlocking position, the locking pin is moved by means of the drive and thus by means of the electric motor of the drive in the direction of its unlocking position. In this case, an actuating member of the locking pin, said member being fixedly disposed on the locking pin, is shifted from a first position to a second position. Due to the fixed arrangement of the actuating member on the locking pin, for example, if the actuating member is formed as an integral component of the locking pin, when the actuating member shifts from its first position to its second position, the locking pin is moved simultaneously, namely also from a first position of the locking pin to a second position of the locking pin. In this case, the first position of the locking pin is different from the locking position of the locking pin and the second position of the locking pin is different from the unlocking position of the locking pin. The respective positions, therefore, the first position and the locking position as well as the second position and the unlocking position of the locking pin, therefore, do not necessarily have to correspond.

The actuating member of the locking pin is embodied such that when there is a shift from its first position to its second position, it actuates the at least one switch of the switch assembly such that the switch state of the at least one switch of the switch assembly, during a proper functioning of the switch, changes in a previously specified manner.

For example, the switch assembly could comprise two switches for monitoring the position of the locking pin. Accordingly, when there is a switch of the locking pin from its locking position to its unlocking position and thereby when there is a switch of the actuating member from its first position to its second position, the actuating member of the locking pin would change the switch state of each of the two switches of the switch assembly during a proper functioning of the respective switch, for example, open the one switch and close the other switch. In this case, the switch assembly is disposed relative to the locking pin with the actuating member such that the actuating member reaches its first position shortly after the start of the movement of the locking pin from its locking position to its unlocking position by means of the push button and its second position after a previously specified period of time. The previously specified period of time can be, for example, in the range of a few 100 milliseconds, calculated from the time at which the actuating member has reached its first position. Based on the time when the user pressed the push button, the previously specified period of time can be, for example, in a range of a few seconds.

In the normal case, therefore, if the at least one switch of the switch assembly functions properly, the at least one switch of the switch assembly changes its switch state when the actuating member switches from its first position to its second position in a previously specified manner. For example, as explained above, the one switch of the switch assembly is opened whereas the other switch of the switch assembly is closed. When the actuating member shifts from its first position to its second position, in addition, the power consumption of the electric motor of the drive changes in a previously specified manner.

In the present exemplary embodiment, the power consumption of the electric motor increases at least to a previously specified threshold value when the actuating member shifts from its first position to its second position. Both the switch state of the at least one switch of the switch assembly and the power consumption of the electric motor are analyzed in the analysis unit. Provided that the switch state of the at least one switch of the switch assembly has changed in the previously specified manner, for example, the one switch of the switch assembly has been opened and the other switch of the switch assembly has been closed, and the power consumption of the electric motor of the drive has changed in the previously specified manner, namely has increased at least to the threshold value, the at least one switch of the switch assembly functions properly for monitoring the position of the locking pin.

However, if the switch state of the at least one switch of the switch assembly has not changed in the previously specified manner, for example, one switch of the switch assembly were not to have been opened and the other switch of the switch assembly were not to have been closed, the at least one switch of the switch assembly does not function properly for monitoring the position of the locking pin and the analysis unit triggers a fault action. The fault action could be, for example, a switching off of the electric motor of the drive and thus a stopping of the locking pin. However, it would also be conceivable for the fault action to be embodied merely as an output of an acoustic and/or visual error message to the user, for example, on a display in the vicinity of the push button or on the push button itself.

Because the first and second positions of the locking pin are close to the locking position of the locking pin, it is possible to detect any malfunction of the at least one switch of the switch assembly promptly after the start of the shifting of the locking pin from its locking position to its unlocking position. Accordingly, the triggering of a fault action, for example, one of the abovementioned fault actions, is possible at an early stage.

In order to create a fault detection that is robust against interfering influences, for example, power surges or the like, it is provided in the present exemplary embodiment that the change in the power consumption of the electric motor in a previously specified manner, when the actuating member is shifted from its first position to its second position, comprises as a further condition the presence of the power consumption increased to at least the previously specified threshold value for at least a previously specified period of time, apart from the increase in the power consumption of the electric motor to at least the previously specified threshold value. Accordingly, the analysis unit not only analyzes whether the power consumption during the aforementioned shift has increased at least to the threshold value, but whether the power consumption was at or above the threshold value during the entire duration of the previously specified period of time. The previously specified period of time can be, for example, in the range of a few 100 milliseconds, calculated from the time at which the actuating member has reached its first position.

A computer-program product can be provided that comprises instructions that cause the device according to the present exemplary embodiment to carry out the method steps of the method according to the present exemplary embodiment.

Furthermore, a computer-readable medium can be provided on which the aforementioned computer program product is stored.

BRIEF DESCRIPTION OF THE DRAWINGS

The present invention will become more fully understood from the detailed description given hereinbelow and the accompanying drawings which are given by way of illustration only, and thus, do not limit the present invention, and wherein.

DETAILED DESCRIPTION OF THE PREFERRED EMBODIMENTS

Figure 1:
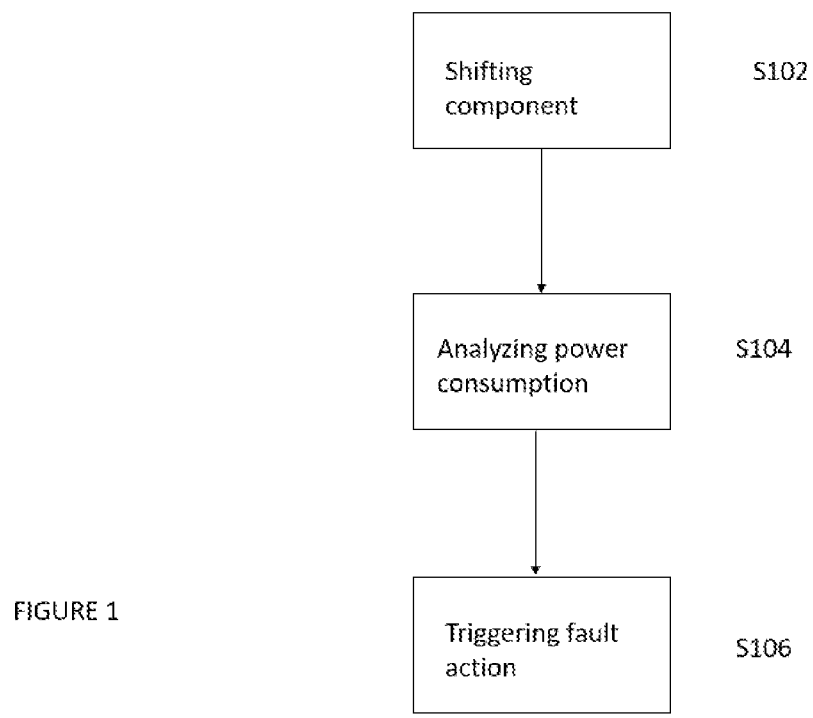
FIG. 1 illustrates a method 100 for detecting faults in a switch according to an exemplary embodiment of the present invention.

FIG. 1 illustrates a method 100 for detecting faults in a switch assembly 202 (see FIG. 2) comprising at least one switch (202a) for monitoring a position of a component 204 that is adapted to be moved via a drive 206 which has an electric motor. The method includes shifting (S102) the movable component from a first position to a second position spatially separated from the first position, wherein the power consumption of the electric motor changes in a previously specified manner, and wherein the switch state of the switch during a proper functioning of the switch changes in a previously specified manner, analyzing (S104) the power consumption of the electric motor and the switch state of the switch in an analysis unit, and triggering (S106) a fault action if the power consumption of the electric motor has changed in the previously specified manner and the switch state of the switch has not changed in the previously specified manner.

Figure 2:
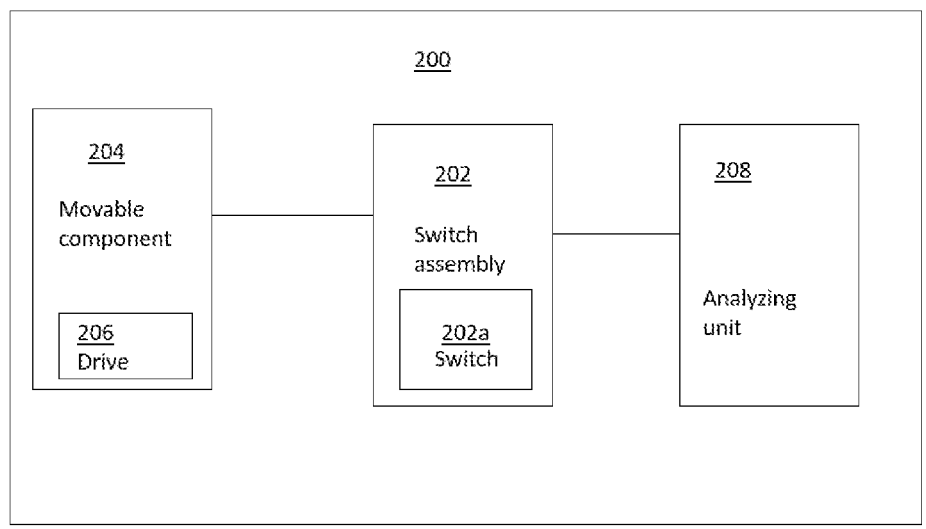
FIG. 2 illustrates a device 200 for carrying out the method according to an exemplary embodiment of the present invention.

A device 200 for carrying out the above method is illustrated in FIG. 2 and includes a component 204 movable by means of a drive 206 which has an electric motor; a switch assembly 202 with at least one switch 202a for monitoring the position of the movable component; and an analysis unit 208 for analyzing a switch state of the switch. The movable component is adapted to be shifted via the drive from a first position to a second position spatially separated from the first position. During the shifting of the movable component, during a proper functioning of the switch, the switch state of the switch changes in a previously specified manner, characterized in that during the switching of the movable component, the power consumption of the electric motor changes in a previously specified manner and the analysis unit is designed such that depending on the analysis of the switch state of the switch and an analysis of the power consumption of the electric motor, a fault action can be triggered by the analysis unit.

The invention is not limited to the present exemplary embodiment. For example, it is conceivable that the method of the invention in the case of the movable component shifted to its second position additionally comprises the following method steps: shifting the movable component from its second position to its first position, wherein the power consumption of the electric motor changes in a further previously specified manner, and wherein the switch state of the switch during a proper functioning of the switch changes in a further previously specified manner; analyzing the power consumption of the electric motor and the switch state of the switch in the analysis unit and triggering a further fault action, if the power consumption of the electric motor has changed in the further previously specified manner and the switch state of the switch has not changed in the further previously specified manner.

The same applies to the device of the invention for carrying out the method of the invention, in which the movable component can be additionally shifted by the drive from the second position to the first position, and in which in the aforementioned shifting of the movable component, the switch state of the switch during a proper functioning of the switch changes in a further previously specified manner, namely that changes in the aforementioned shifting of the movable component, the power consumption of the electric motor changes in a further previously specified manner and the analysis unit is designed such that depending on the analysis of the switch state of the switch and the analysis of the power consumption of the electric motor, a further fault action can be triggered by the analysis unit.

At least one of the switches of the switch assembly with at least one switch for monitoring the position of the movable component can be embodied as a diagnosable switch. In this way, for example, a redundancy in the fault detection of the invention is realized.

Deviating from the exemplary embodiment, it is conceivable that the switch assembly comprises only a single switch or more than two switches for monitoring the position of a component that can be moved by means of a drive which has an electric motor.

The trailer hitch could also be designed as a fully automatic trailer hitch. The movable component can also be another component of a trailer hitch or other device. The same applies to the fault action and the further fault action, which are not limited to the actions mentioned by way of example in the present exemplary embodiment.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for detecting faults in a switch assembly comprising at least one switch for monitoring a position of a component that is adapted to be moved via a drive which has an electric motor, the method comprising:
   shifting the component from a first position to a second position spatially separated from the first position, wherein a power consumption of the electric motor changes in a previously specified manner, and wherein a switch state, the switch state defining whether the at least one switch is open or closed, of the at least one switch during a proper functioning of the at least one switch changes in a previously specified manner,
   analyzing the power consumption of the electric motor and the switch state of the at least one switch in an analysis unit, and
   triggering a fault action if the power consumption of the electric motor has changed in the previously specified manner and the switch state of the at least one switch has not changed in the previously specified manner.

2. The method according to claim 1, in the case of the component, shifted to its second position further comprising:
   shifting the component from its second position to its first position, wherein the power consumption of the electric motor changes in a further previously specified manner, and wherein the switch state of the at least one switch during a proper functioning of the at least one switch changes in a further previously specified manner,
   analyzing the power consumption of the electric motor and the switch state of the at least one switch in the analysis unit, and
   triggering a further fault action, if the power consumption of the electric motor has changed in the further previously specified manner and the switch state of the at least one switch has not changed in the further previously specified manner.

3. The method according to claim 1, wherein the power consumption of the electric motor increases at least to a previously specified threshold value when the component shifts from its first position to its second position or increases at least to a further previously specified threshold value when the component shifts from its second position to its first position.

4. The method according to claim 1, wherein the change in the power consumption of the electric motor when the component shifts from its first position to its second position continues at least for a previously specified period of time or when the component shifts from its second position to its first position continues at least for a further previously specified period of time.

5. A device for carrying out the method according to claim 1, comprising:
   the component movable by means of the drive which has the electric motor;
   the switch assembly with at the least one switch for monitoring the position of the component; and
   the analysis unit for analyzing the switch state of the at least one switch,
   wherein the component is adapted to be shifted via the drive from the first position to the second position spatially separated from the first position, and
   wherein during the shifting of the component, during a proper functioning of the at least one switch, the switch state of the at least one switch changes in a previously specified manner, wherein during the switching of the component, the power consumption of the electric motor changes in a previously specified manner and the analysis unit is designed such that depending on the analysis of the switch state of the at least one switch and an analysis of the power consumption of the electric motor, a fault action can be triggered by the analysis unit.

6. The device according to claim 5, wherein the component is adapted to be shifted via the drive additionally from the second position to the first position, and wherein, in the aforementioned shifting of the component, the switch state of the at least one switch changes in a further previously specified manner during a proper functioning of the at least one switch, wherein in the aforementioned shifting of the component, the power consumption of the electric motor changes in a further previously specified manner and the analysis unit is designed such that, depending on the analysis of the switch state of the at least one switch and the analysis of the power consumption of the electric motor, a further fault action can be triggered by means of the analysis unit.

7. The device according to claim 5, wherein the component is a locking pin for locking a trailer hitch for a motor vehicle.

8. The device according to claim 5, wherein the at least one of the switches of the switch assembly is a diagnosable switch.

9. A computer program product comprising instructions that cause the device to carry out the method according to claim 1.

10. A non-transitory computer-readable storage medium on which the computer program product according to claim 9 is stored.

11. The method according to claim 1, wherein the component and the at least one switch are separate and independent components.

12. The method according to claim 1, wherein the component is a locking pin.

13. The method according to claim 1, wherein the component is a locking pin configured to lock a trailer hitch.

14. The method according to claim 13, wherein an end position of the locking pin is detected to determine whether or not the trailer hitch has been locked.

15. The method according to claim 1, wherein the at least one switch is driven by the component.

16. The method according to claim 1, wherein a distance covered by the component is determined by the power consumption of the electric motor.

17. The method according to claim 1, wherein the fault action comprises switching off the electric motor.

18. The method according to claim 1, wherein the fault action comprises outputting an error message.

19. The method according to claim 1, wherein the fault action is triggered if the power consumption is increased to at least a previously specified threshold value for at least a previously specified period of time.

20. The method according to claim 1, wherein said fault action is triggered by an analysis unit configured to analyze the switch state and the power consumption of the electric motor.

21. The method according to claim 1, wherein the at least one switch is a diagnosable switch.

\* \* \* \* \*